United States Patent
Aspell et al.

(10) Patent No.: US 6,337,939 B1
(45) Date of Patent: Jan. 8, 2002

(54) OPTICAL AMPLIFIER MONITOR USING A BLAZED GRATING

(75) Inventors: Jennifer Aspell, Holmdel; Donald R. Zimmerman, Farmingdale, both of NJ (US)

(73) Assignee: JDS Uniphase Inc., Nepean (CA)

( * ) Notice: Subject to any disclaimer, the term of this patent is extended or adjusted under 35 U.S.C. 154(b) by 0 days.

(21) Appl. No.: 09/495,374

(22) Filed: Feb. 1, 2000

(51) Int. Cl.[7] .................................................. G02B 6/34
(52) U.S. Cl. .............................. 385/37; 385/37; 385/10; 372/6
(58) Field of Search ........................ 385/37, 10; 372/6, 372/29, 31, 32

(56) References Cited

U.S. PATENT DOCUMENTS

| | | | |
|---|---|---|---|
| 5,768,012 A | 6/1998 | Zanoni et al. | 359/341 |
| 5,832,156 A | 11/1998 | Strasser et al. | 385/48 |
| 5,841,797 A | 11/1998 | Ventrudo et al. | 372/6 |
| 5,850,302 A | 12/1998 | Strasser et al. | 359/127 |
| 6,002,822 A | 12/1999 | Strasser et al. | 385/48 |
| 6,122,422 A | * 9/2000 | Koeppen et al. | 385/37 |

* cited by examiner

*Primary Examiner*—Darren Schuberg
*Assistant Examiner*—Fayez Assaf
(74) *Attorney, Agent, or Firm*—Randy W. Lacasse; Kevin E. Greene; Lacasse & Associates

(57) ABSTRACT

The traditional solution to monitoring the pump laser power uses the back facet of the pump laser to monitor its power. However, stability and aging issues of the back facet may make it difficult or even impossible to measure the pump power to a high degree of accuracy using this method. Pump lasers often use fiber Bragg gratings to stabilize their wavelength. However, if an in-line optical fiber blazed Bragg grating is used, then the pump power is coupled out of the grating to a detector and monitored. The method of the present invention minimizes components and provides a direct monitoring of fiber coupled power. Alternatively, light coupled out of a WDM is used in a similar manner to monitor the pump power.

16 Claims, 5 Drawing Sheets

OPTICAL AMPLIFIER MONITOR USING A BLAZED GRATING

FIELD OF THE INVENTION

This invention relates to an optical amplifier and in particular to monitoring a pump power of an optical amplifier.

BACKGROUND OF THE INVENTION

Improvements in optical amplifiers have vastly enhanced the use of optical communication systems by increasing both data rates and the distances over which optical signals are transmitted. Optical amplifiers are used to intensify optical signals that are attenuated along the fiber-optic communication path. A significant advancement in such amplifiers is the development of optical amplifiers based on an optical fiber doped with a rare-earth element. These types of amplifiers have replaced cumbersome electrical repeaters in fiber-optic communication links allowing true all-fiber optical communications systems to be realized. Conventional repeaters require complex electronics to convert light into electric signals, amplify the signal, recover the data from the amplified signal, and then transform it back into light. In contrast, doped-fiber optical amplifiers do not interrupt the light signal, but merely add energy to it. The components in the optical amplifier system are comparatively simple. Similarly, optical fiber lasers have been proposed to generate an optical carrier for fiber-optic communications systems. These types of lasers can be externally modulated or mode locked, and in some cases are alternatives to diode lasers as sources of high-power light in fiber optic communications systems.

Both, fiber amplifiers and lasers operate on similar principles. The silica glass in the guided-wave portion of the optical fiber is doped with traces of ions of rare-earth elements, such as erbium, ytterbium, neodymium, or praseodymium. The energy structure of the erbium ions, for example, is such that signal light with wavelengths of approximately 1530–1565 nm can be amplified in the fiber if the population of the excited states of the erbium ions is such that a rate of stimulated emission exceeds that of spontaneous emission and absorption. In this event, light within the gain bandwidth entering the optical fiber will experience a net gain and exit the fiber with greater power. If a mechanism is established to re-circulate this amplified signal in the fiber, for example by placing appropriate reflectors at the ends of the fiber, then laser action occurs in the fiber if the net gain equals the loss of the light within some optical bandwidth. In either case, it is crucial to excite the erbium ions into the proper excited state for a gain to occur. This is accomplished by exciting/pumping the erbium ions with light of a suitable wavelength, for example 980 nm or 1480 nm, which is most conveniently provided by a commercially available high-power diode laser that is coupled into the guided wave portion of the optical fiber. Pumping the erbium ions at these wavelengths will configure the erbium ions to amplify signal light within a wavelength range of approximately 1535 nm to 1565 nm. The relatively small cross-sectional area of this portion helps to ensure a high intensity and therefore allows an appreciable gain of the signal wavelengths. However, those skilled in the art will appreciate that the properties of the signal produced by such an amplifier or laser will depend to a large extent on the properties of the diode laser used to pump the fiber itself.

FIG. 1 illustrates a block diagram of a prior art optical amplifier designated with reference numeral 110. The block diagram is a simplified illustration of commercially available amplifiers, such as the FiberGain™ Module available from Corning Incorporated of Corning, N.Y., and identified as part number CL-10. Amplifier 110 includes an optical fiber 112 that is doped with an ion of a rare-earth element. In the preferred embodiment, the dopant is erbium. Other ions of rare-earth elements, such as neodymium, also have been used as dopants for the fiber, but erbium remains as the most prominent and successful. Optical fiber 112 provides an input 114 for receiving a light input signal, $L_{IN}$, and an output 116 for providing an amplified light output signal, $L_{OUT1}$.

Amplifier 110 further includes a light-sourcing device which is typically a laser diode 118. The diode 118 couples power to the amplifier by "pumping" energy into optical fiber 112 and, hence, is also known as a pump laser diode. Specifically, the light provided by laser diode 118 is absorbed by the erbium ions in fiber 112, pumping those ions to a high-energy level. When a weakened $L_{IN}$ signal enters fiber 112, the excited erbium ions transfer their energy to the signal in a process known as stimulated emission. As a result, the fiber 112 provides the amplified light output signal, $L_{OUT1}$. The anode of laser diode 118 provides an input 120 for receiving an amplification control current, $I_c$. For ease of illustration, the cathode of laser diode 118 is shown as grounded. It should be understood, however, that alternative configurations may be implemented for activating and deactivating laser diode 118.

Amplifier 110 also includes a pump power detector 122, which is typically a photodiode. Power detector 122 is proximate the sourcing laser diode 118 and, hence, provides an electrical signal, $I_{INT1}$, directly proportional to the light intensity $L_{PLD}$ of pump laser diode 118. Signal $I_{INT1}$ is detectable at output 124 of amplifier 110. In commercially available amplifiers, power detector 122 is often referred to as a "rear facet detector" due to its physical relationship to laser diode 118. Specifically, a small portion of the light emitted by laser diode 118 is reflected "rearwardly" to the detector, thereby giving the detector its name. As known in the art, the photodiode converts the light to an electrical signal, i.e. $I_{INT1}$, indicative of the intensity of the detected light.

While amplifier 110 of FIG. 1 provides numerous advantages over repeaters, developmental efforts continue in an attempt to increase optical system performance, including device reliability. For example, it is known in the art to include a feedback circuit which adjusts $I_c$ to maintain a constant light output signal, $L_{OUT1}$. Thus, as $L_{IN}$ changes in intensity or wavelength, $I_c$ is altered to maintain $L_{OUT}$ at a fixed level. When $L_{IN}$ falls below a certain level, or is removed completely, the feedback system would try to greatly increase the magnitude of $I_c$. However, above a certain level of optical output power, diode 118 will be damaged. Therefore, such a system will include a current limit for $I_c$, limiting it to a value that does not produce a damaging level of optical output power. As diode 118 ages, its efficiency decreases, producing a lower level of optical output for a given $I_c$. This reduces the amplifier performance and reduces its useful lifetime.

Thus, it is apparent that there is a need in accurately monitoring the pump power in an optical amplifier.

There are already various known constructions of optical waveguides, including optical fibers, that are provided with embedded gratings for being used either for inserting light into or for removing light from the respective optical waveguide at an intermediate location or at different intermediate locations of the waveguide. For example, U.S. Pat. No. 4,749,248 to Aberson, Jr. et al, issued on Jun. 7, 1988, discloses a device for tapping radiation from, or injecting radiation into, a single mode optical fiber. Aberson, Jr. et al disclose that it is possible to convert a guided mode in an optical fiber into a tunneling leaky mode or vice versa by forming a grating of appropriate periodicity at least in the core of the optical fiber, and either to remove the guided mode from the fiber core into the cladding by converting it into the leaky mode, and ultimately from the fiber altogether, or to insert light of an appropriate wavelength into the core to form a guided mode therein by directing light of a proper wavelength from the exterior of the fiber toward the grating to propagate in the fiber cladding and to be converted by the grating into the guided mode in the fiber core. The guided mode that is removed from the fiber core can then be used to monitor the pump power of a laser of an optical amplifier. Even though such an arrangement can achieve satisfactory results in some applications one major disadvantage remains however, in that this approach results in very high losses of optical power coupled out of the optical fiber. This is at least partially attributable to the fact that, inasmuch as the grating is imposed normal to the longitudinal axis of the core, the conversion of the guided mode into the leaky mode takes place with uniform distribution all around the optical fiber axis, so that a predominant proportion of the leaky mode is not captured by the sensing arrangement when this approach is being used to tap light out of the fiber.

It is an object of the invention to provide an optical amplifier monitor having an embedded blazed grating optical waveguide.

It is a further object of the invention to provide a device for measuring the pump power of a laser in an optical amplifier to a high degree of accuracy.

The traditional solution to monitoring the pump laser power uses the back facet of the pump laser to monitor its power. However, stability and aging issues of the back facet may make it difficult or even impossible to measure the pump power to a high degree of accuracy using this method. Pump lasers often use fiber Bragg gratings to stabilize their wavelength. However, if a blazed grating is used, then the pump power is coupled out of the grating to a detector and monitored. The method of the present invention minimizes components and provides a direct monitoring of fiber coupled power. Alternatively, light coupled out of a WDM is used in a similar manner to monitor the pump power.

SUMMARY OF THE INVENTION

In accordance with the invention there is provided a feedback, feedforward optical circuit having a monitor tap comprising: a Bragg grating having a reflection band at a laser wavelength $\lambda_L$ for reflecting no more than 10% of light incident thereon backwards for providing feedback, said Bragg grating being disposed in an optical fiber having a core and a cladding, and wherein said Bragg grating has a reflection spectrum having one or more side lobes adjacent the reflection band of wavelengths for reflecting light of a wavelength corresponding to the one or more side lobes being different than the laser wavelength $\lambda_L$, said Bragg grating further having a blaze with respect to an optical axis of the optical fiber, the grating having a blaze angle that will direct less than 5% of light incident thereon out of the optical fiber through the cladding, said light having a wavelength corresponding to a wavelength $\lambda_L$, and the grating having a transmission spectrum such that at least 85% of light incident thereupon propagates through the grating without reflecting backwards at the wavelength $\lambda_L$; and, a detector disposed to receive and detect light directed out through the cladding.

In accordance with the invention there is further provided a feedback, feedforward optical circuit having a monitor tap comprising: (a) a pump laser for providing light having a laser wavelength $\lambda_L$; (b) a blazed Fiber Bragg grating disposed within a core of an optical fiber for receiving the laser wavelength $\lambda_L$ from the pump laser, said blazed fiber Bragg grating having a reflection band at the laser wavelength $\lambda_L$ for reflecting no more than 10% of the light incident thereon backwards for providing feedback, said blazed fiber Bragg grating has a reflection spectrum having one or more side lobes adjacent the reflection band, said side lobes having wavelengths for reflecting light of a wavelength corresponding to the one or more side lobes and wherein said wavelengths of the side lobes are different than the laser wavelength $\lambda_L$, said blazed fiber Bragg grating having a transmission spectrum such that at least 85% of light incident thereupon propagates through the grating without reflecting backwards at the wavelength $\lambda_L$, and said blazed fiber Bragg grating further having a blaze with respect to an optical axis of the optical fiber, the blazed fiber Bragg grating having a blaze angle such that the blazed fiber Bragg grating directs less than 5% of light incident thereon out of the optical fiber through a cladding, said light being directed out of the optical fiber having a wavelength corresponding to a wavelength $\lambda_L$; (c) a detector disposed to receive and detect the light being directed out through the cladding of the optical fiber through the blazed fiber Bragg grating, and wherein said detector is for providing a control signal; and (d) a control circuit for receiving the control signal from the detector and for providing the control signal to the pump laser for monitoring a power level of the pump laser.

BRIEF DESCRIPTION OF THE DRAWINGS

Exemplary embodiments of the invention will now be described in accordance with the drawings in which.

DETAILED DESCRIPTION OF THE INVENTION

Figure 1:
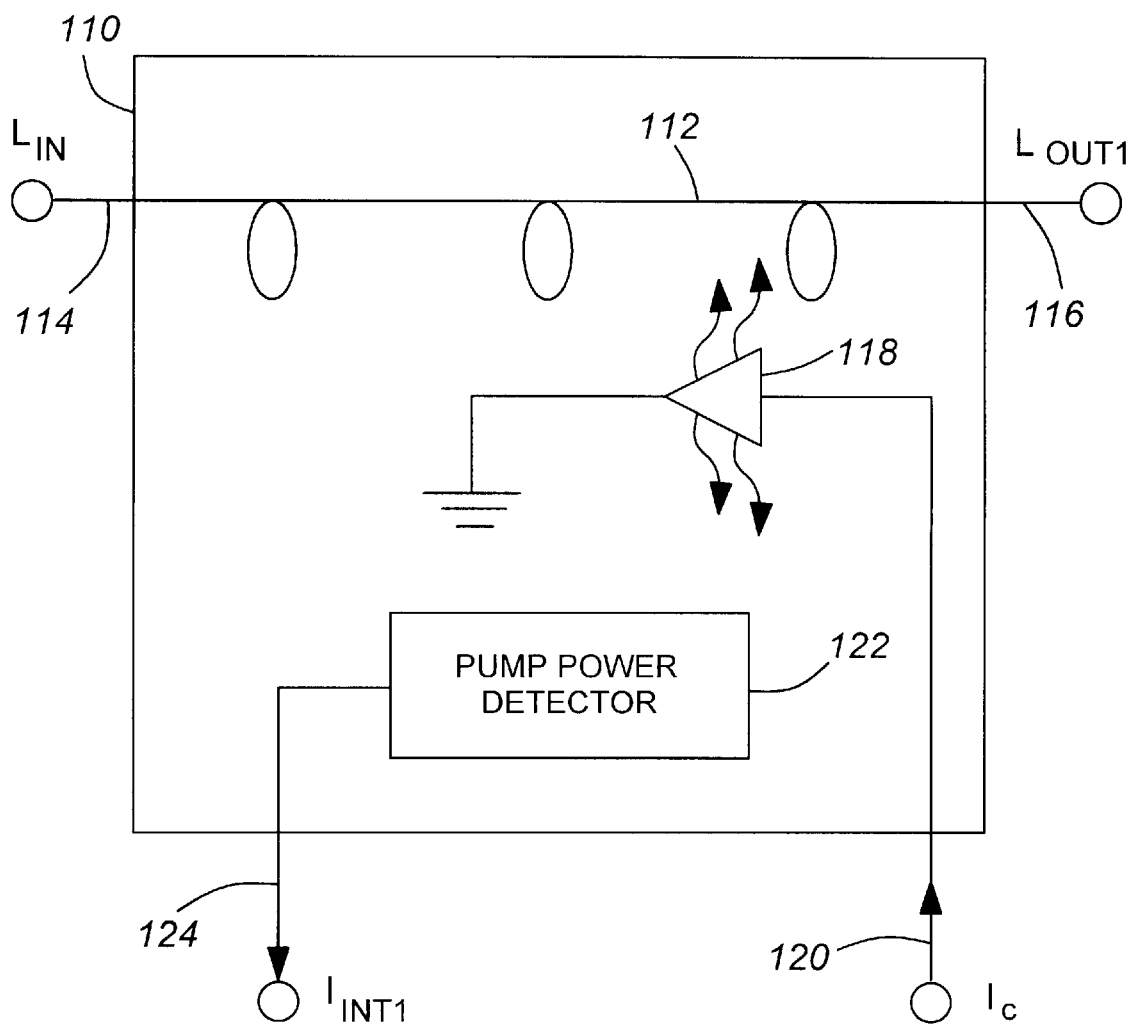
FIG. 1 illustrates a block diagram of a prior art optical amplifier.
Figure 2:
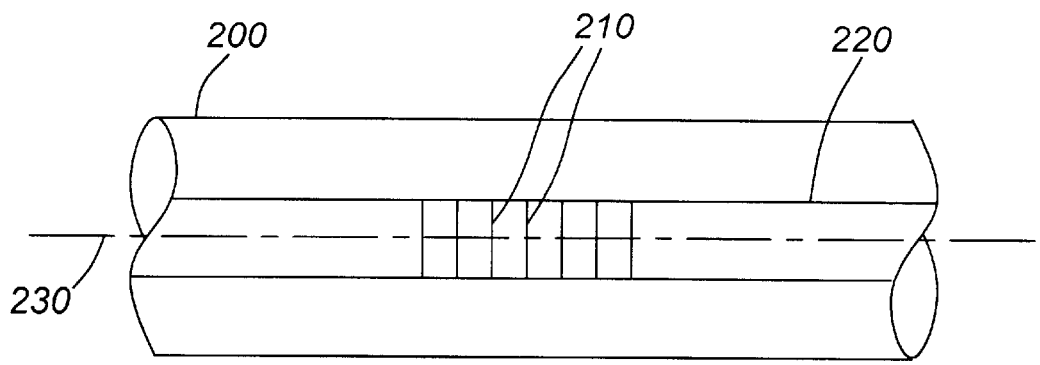
FIG. 2 illustrates a partial schematic of a selected section of a prior art optical waveguide.

Turning to FIG. 2 a partial schematic of a selected section of a prior art optical waveguide is illustrated as taught in U.S. Pat. No. 4,725,110 to Glenn et al. The core 220 of optical waveguide 200 is preferably a Germanium-doped silica or glass filament. The core 220 contains a Bragg reflection gratings 210. The periodic gratings 210 or refractive index perturbations are permanently impressed into the optical fiber core by exposing the core through the cladding to the interference pattern of two coherent ultraviolet light beams that are directed against the optical fiber at two angles relative to the fiber axis that complement each other to 180°. This results in a situation where the grating is oriented normal to the fiber axis 230 so that it reflects, of the light launched into the fiber core 220 for guided propagation therein in a propagation direction, only that having a wavelength within a very narrow range, back along the fiber axis 230 opposite to the original propagation direction so that such reflected light is guided in the core 220 to the point at which the original light had been launched into the fiber core 220. On the other hand, grating 210 is transparent to light at wavelengths outside the aforementioned narrow band so that it does not affect the further propagation of such other light. It may be seen that this approach has its limitations as well in that it is not suited for removing substantial amounts of light from or launching them into the fiber at any other location than the respective fiber ends.

Figure 3:
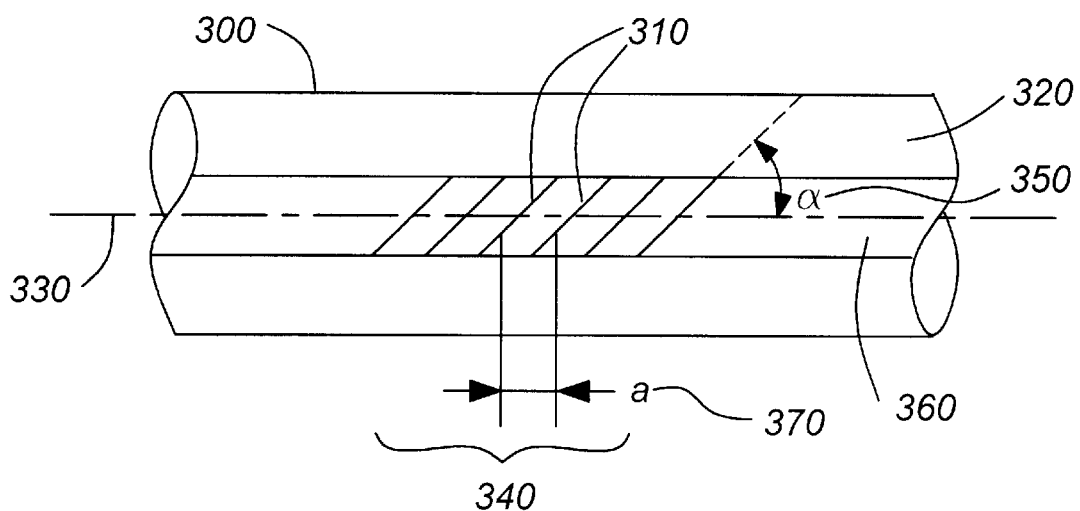
FIG. 3 illustrates a partial schematic of a selected section of another prior art optical waveguide.

FIG. 3 illustrates a partial schematic of a selected section of another prior art optical waveguide 300 as disclosed by Meltz and Glenn in U.S. Pat. No. 5,042,897. The waveguide 300 is shown to be configured as an optical fiber of which only a relatively short longitudinal portion is depicted and which includes a fiber core 360 and a fiber cladding 320 surrounding the fiber core 360. The fiber core 360 incorporates a grating region 340 that includes a multitude of grating elements 310 each extending at substantially a same oblique angle α 350 with respect to the longitudinal axis 330 of the fiber core 360. The grating elements 310 are spaced the same distance a 370 from one another as considered in the longitudinal direction of the optical fiber 300.

U.S. Pat. No. 5,042,897 entitled "Optical Waveguide Embedded Light Redirecting Bragg Grating Arrangement" and U.S. Pat. No. 5,061,032 entitled "Optical Waveguide Embedded Light Redirecting and Focusing Bragg Grating Arrangement" both in the name of Meltz et al., include an optical waveguide light redirecting arrangement including an optical waveguide, such as illustrated in FIG. 3, having a solid portion that guides light in a first path along a longitudinal axis 330, with at least one grating region 340 being embedded in the solid portion at a location remote from its end portions. The grating region 340 includes a multitude of grating elements 310 extending at such longitudinal spacings a 370 and at such oblique angles α 350 relative to the longitudinal axis 330 to redirect light reaching the grating elements 310 between the first path and at least one second path extending externally of the waveguide 300 and diverging between a focus situated at a predetermined distance from the waveguide 300 and the grating region. When light is directed in one of the first and second paths toward the grating region 340, it is redirected by the grating elements 310 into the respectively other of the second and first paths with attendant in-phase combination in the other path of light having a wavelength within a range around a central wavelength. The grating elements 310 are formed in the waveguide 300 by exposing waveguide 300 to an interference pattern of two ultraviolet radiation beams that are symmetrical with respect to a plane extending at the oblique angle α relative to the waveguide axis 330 at the center of the grating region 340.

The solution presented in these patents involves writing the grating elements at an oblique angle relative to the longitudinal axis of the waveguiding region, such as of a fiber core, so that the thus formed blazed grating redirects light between a first path extending longitudinally of the waveguiding region, and at least one second path extending between the grating and the exterior of the waveguide in a direction that depends on the axial wavenumber or wavelength of the light being so redirected. This second path is shown to have a dimension as considered in the longitudinal direction of the waveguide that substantially corresponds to the associated dimension of the grating, and an external lens is being used in the second path to either focus the light emanating from the fiber or to collimate light issued by an external source onto the grating, depending on whether the grating is being used to tap light out of the waveguide or launch light into the waveguide.

In-line optical fiber gratings have become nearly ubiquitous in the manufacture of optical telecommunications components. Both short period reflective gratings and long period transmissive gratings are useful and widely used as filters. Long period in-fiber gratings have been used to purposely couple light out into the cladding of an optical fiber, and short period Bragg gratings are generally used as reflective filters in multiplexors and dispersion compensating circuits. For example U.S. Pat. No. 5,557,468 in the name of Ip entitled "Chromatic Dispersion Compensation Device" assigned to J D S Fitel Inc. discloses the use of a reflective Bragg grating in a dispersion compensator. U.S. Pat. No. 5,608,825 in the name of IP entitled "Multi-wavelength Filtering Device Using Optical Fiber Bragg Grating" assigned to J D S Fitel Inc. discloses the use of a reflecting Bragg grating in a multiplexor. U.S. Pat. No. 5,748,363 in the name of Duck et al. entitled "Wavelength Dependent Crossover System for Bi-directional Transmission" assigned to J D S Fitel Inc. discloses Bragg optical fiber diffraction gratings and a single erbium-doped optical amplifier (EDFA) to implement at least dual wavelength bi-directional-single fiber- optical amplifier module. In the '468, '825, and '363 patent mentioned above, the Bragg gratings were designed to be as close to 100% reflective as possible at the Bragg reflection wavelength.

In accordance with an embodiment of the present invention an in-line optical fiber blazed Bragg grating is used that allows most of the signal to be transmitted through the blazed grating and a small percentage of the signal to be spilled off to a monitor tap. For example, in accordance with a preferred embodiment of the present invention the blazed grating allows about 97% transmission, 2–4% reflection back into the laser cavity, and about 1% or less of a signal intensity as spill off to the monitor.

Figure 4:
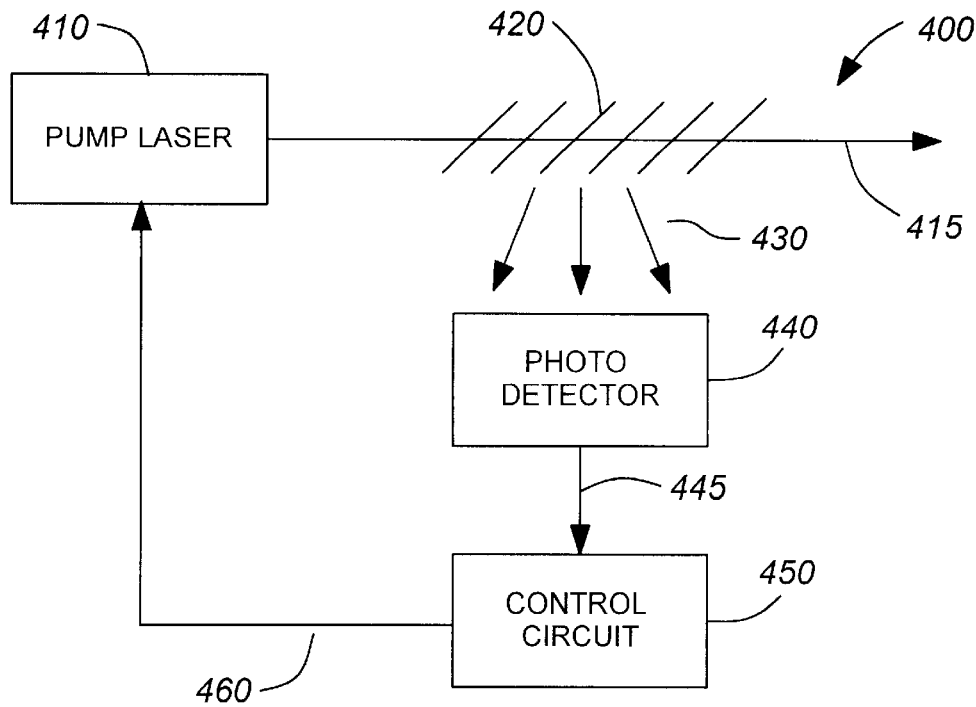
FIG. 4 a schematic presentation of an optical amplifier monitor tap in accordance with an embodiment of the present invention.

FIG. 4 presents a schematic presentation of an optical amplifier monitor tap in accordance with an embodiment of the present invention. Scattered light 430 is used as a means of monitoring the pump power in optical amplifier 400. A pump laser 410 is emitting a light signal 415. Light signal 415 passes through a blazed fiber Bragg grating 420 which causes a small percentage of the signal 415 to be reflected back to the pump laser and an even smaller percentage of the light signal 415, i.e. 1% or less, to be directed to a photodetector 440. The photodetector 440 sends a signal 445 to a control circuit 450. The control circuit 450 in turn sends a signal 460 to the pump laser to control a pump laser power. In the prior art the back facet of the pump laser 410 is used to monitor the pump laser power. As already mentioned above, stability and aging issues of the back facet cause difficulties when attempting to measure the laser pump power with a high degree of accuracy. Pump lasers often use fiber Bragg gratings to stabilize their wavelength. However, if a blazed grating is used, then some of the signal can be coupled out of the grating to a detector where the signal is monitored.

Figure 5:
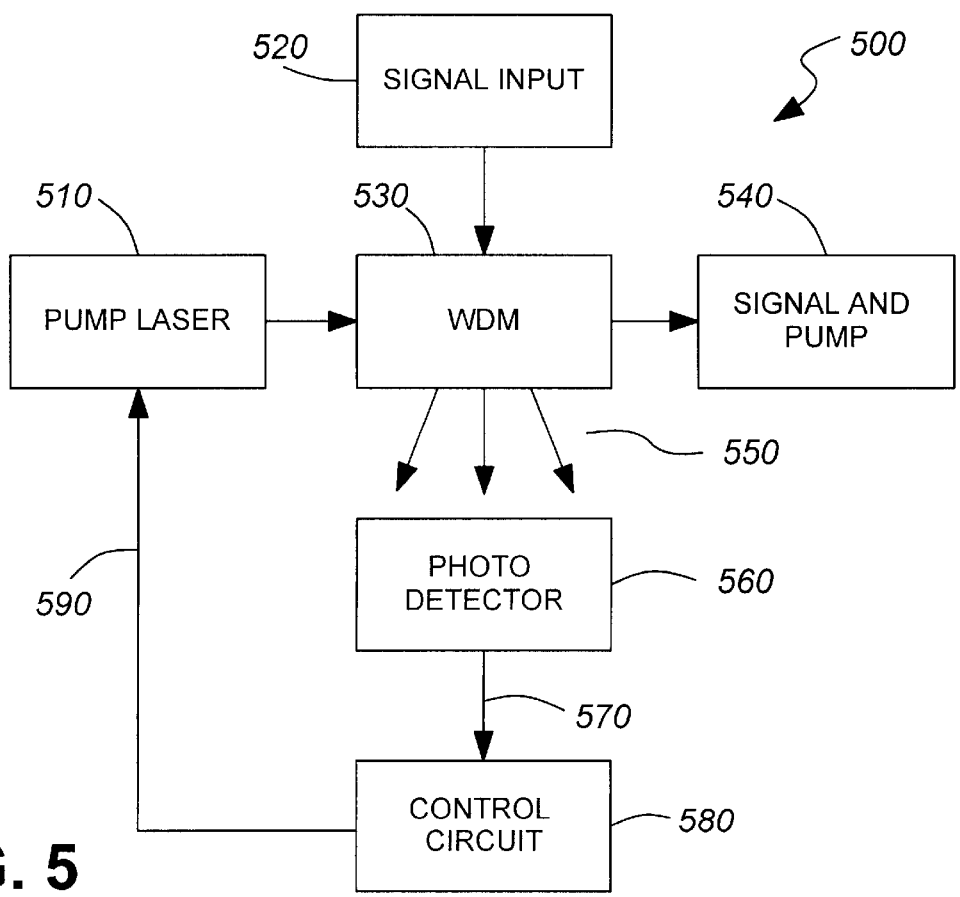
FIG. 5 shows a schematic presentation of another optical amplifier monitor tap in accordance with another embodiment of the present invention.

Alternatively, light coupled out of WDM is used in a similar manner to monitor the laser pump power. This is illustrated in FIG. 5 showing a schematic presentation of another optical amplifier monitor tap in accordance with another embodiment of the present invention. Optical device 500 provides a signal input 520 to a WDM 530. A pump laser 510 sends laser light to WDM 530 in order to amplify the input signal 520. Signal 540 presents an amplified output signal. A blazed fiber Bragg grating is disposed within WDM 530 providing scattered light 550 as a spill off to photodetector 560. The photodetector 560 sends a control signal 570 to control circuit 580, which in turn provides a feedback signal 590 to the pump laser 510. The feedback signal 590 is used to adjust the power of the laser pump.

The blazed fiber Bragg grating in accordance with an embodiment of the present invention is disposed within the fiber core of an optical fiber. The fiber core is surrounded by a cladding. The fiber core incorporates a grating region including a plurality of grating elements each extending at substantially a same oblique angle α with respect to the longitudinal axis of the core. The grating elements are spaced the same distance from one another as considered in the longitudinal direction of the optical fiber similar to the prior art optical fiber including a blazed fiber Bragg grating depicted in FIG. 3. When the grating elements are spaced in this manner, consecutive ones of the grating elements are present at the same periodic spacings throughout the grating region but are absent from regions of the fiber core that are longitudinally consecutive with the respective ends of the grating region. Thus, the light that is guided out, or to be launched into, the core is redirected out of or into the optical fiber, respectively, solely at the grating region and not elsewhere in the optical fiber, thus avoiding unnecessary and highly undesirable optical power losses. While only a quite small portion of the light propagating through the fiber core or being launched into the core is redirected at each of the grating elements as a result of the refractive index changes attributable to the presence of the grating elements, subsequently to either leave the optical fiber through its cladding or to be launched into the core for guided longitudinal propagation therein, respectively, the cumulative effect of the grating elements is the redirection of a significant proportion of the light the wavelength of which is in a very narrow range.

Furthermore, the light within the narrow range that is thus redirected at any one of the grating elements out of the optical fiber is in such a phase relationship with respect to the light redirected at any other of the grating elements that the thus formed cumulative redirected light beam has a substantially planar wavefront such that substantially none of the thus escaping redirected light is lost to destructive interference or diffraction. Moreover, the thus escaping redirected light beam propagates outside the optical fiber along a single direction determined by the aforementioned oblique angle α, albeit with some fanning out in the circumferential direction, rather than all around the optical fiber; this facilitates the capture of the thus escaping light and increases the proportion of such light that is actually captured.

The effect of this wavelength selective, unidirectional redirection provides an easy capture of the tapped-out redirected light in a narrow wavelength band after the spilled off light escapes from the fiber at the grating region location that may be situated a considerable distance from either one of the ends of the fiber. Thus, the grating region including the inclined grating elements 14 of the present invention constitutes a wavelength selective tap in the optical fiber.

Figure 6:
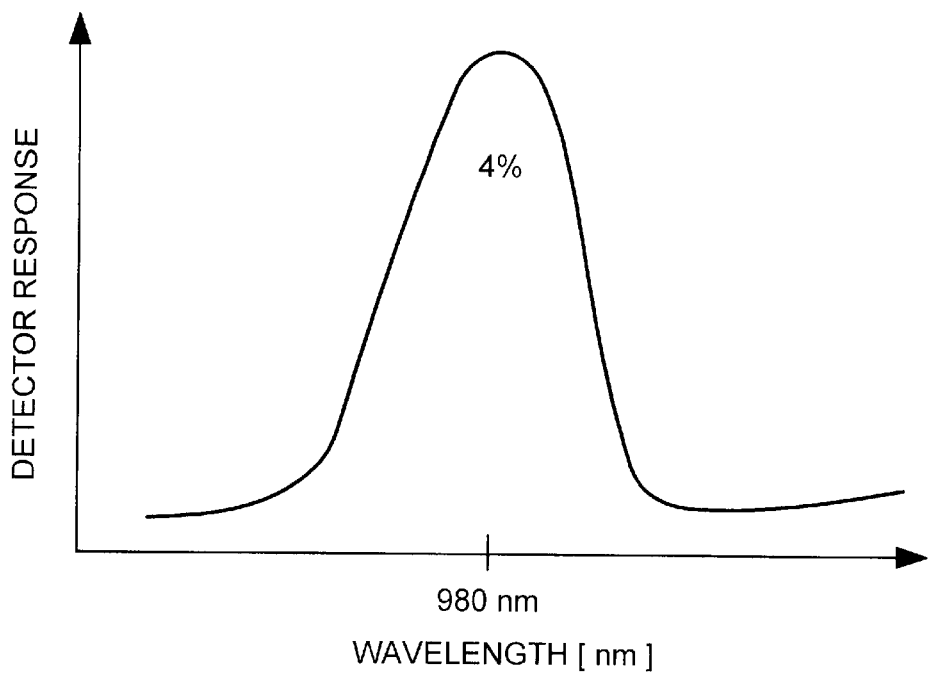
FIG. 6 shows a typical detector response for a light signal passing through a blazed fiber Bragg grating.

FIG. 6 shows a typical detector response for a light signal passing through a blazed fiber Bragg grating. The blazed grating is chosen such that a detector response represents the wavelength of the pump laser to be monitored. A light signal encounters polarization upon passing through a blazed grating. The use of a blazed grating is also disclosed in U.S. Pat. Nos. 5,850,302, 5,832,156 and U.S. Pat. No. 6,002,822 all by Strasser and Wagener disclosing an article comprising an optical waveguide tap. Strasser et al. disclose therein that the blaze angle typically is less than about 15% degrees, with the choice of blaze angle depending on tolerable polarization dependence and desired mode coupling efficiency. The higher the blaze angle, the more polarization-dependent will be the grating characteristics. For example, a blaze of 8 degrees shows less than 0.35 dB of polarization sensitivity in coupled power. On the other hand, for a given refractive index change, the coupling efficiency drops with increasing blaze angle.

Figure 7A:
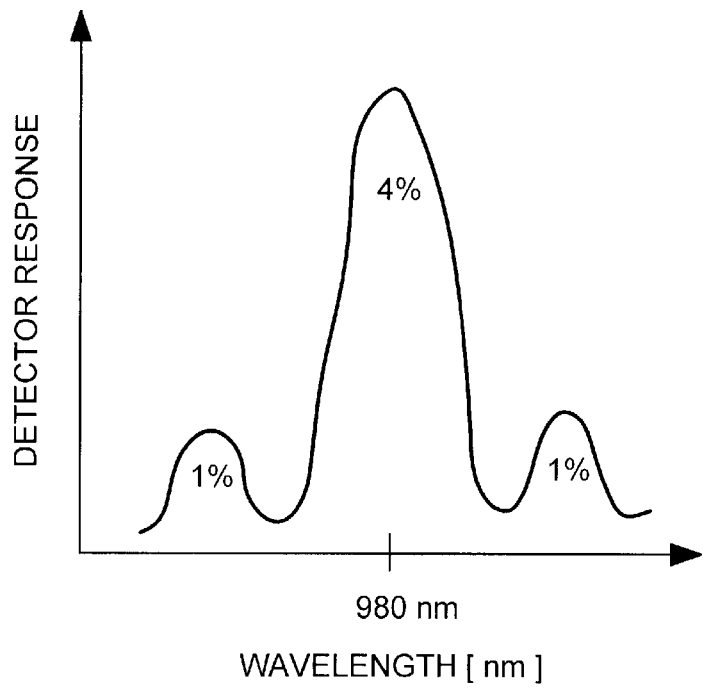
FIGS. 7(a) and 7(b) show detector responses having side lobes for a light signal passing through blazed fiber Bragg grating in accordance with the present invention.
Figure 7B:
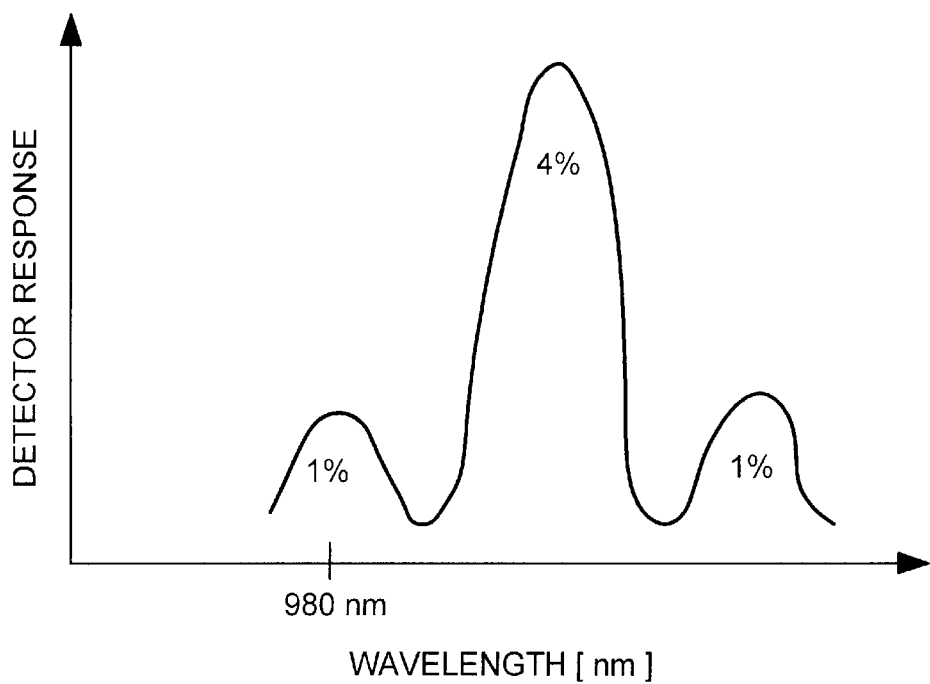

However, after the light signal emitted from the laser pump propagates through the blazed fiber Bragg grating the signal becomes shifted, for example if a wavelength of 980 nm is monitored the signal is not detected anymore after having passed through a blazed Bragg grating. In accordance with an embodiment of the present invention this situation is remedied by providing a blazed grating having distinct changes in refractive indices such as to produce a detector response having side lobes. An example of such a detector response is illustrated in FIGS. 7(a) and 7(b). Generally, the side lobes are determined by apodization. A pure Gaussian apodization, for example, produces no lobes. If no apodization is performed, a plurality of lobes is produced. However, an apodization in between a Gaussian apodization and no apodization produces a level of apodization as presented in FIGS. 7(a) and 7(b). If desired, the side lobes are enhanced by generating a stitch error in the grating. A stitch error is an irregular change in the periodicity of the grating having a series of phase shifts in the grating. Typically these phase shifts are every 50 or 100 µm.

In comparing FIGS. 7(a) and 7(b) it is apparent that the profile of the detector response in FIG. 7(b) is shifted to the right from the profile of the detector response shown in FIG. 7(a). Conveniently through the apodization one of the side lobes moves into the detector window as a wavelength of 980 nm for the laser pump is monitored in the example discussed herein. Thus, a small spill off, for example ca. 1%, from the signal generated by the laser pump is received by a photodetector.

Figure 8:
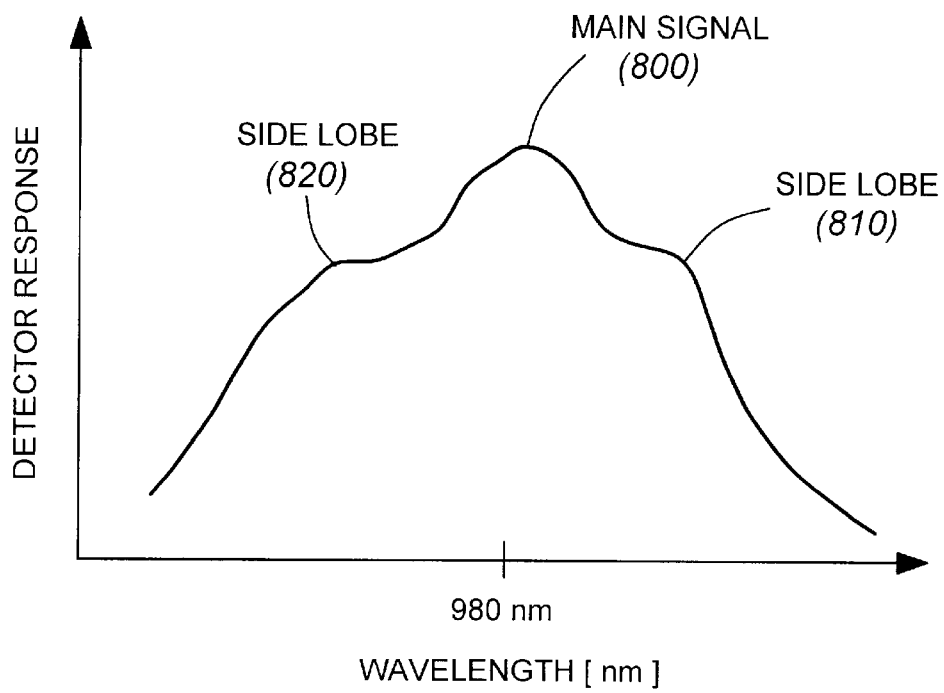
FIG. 8 shows a detector response for a light signal having passed through a blazed fiber Bragg grating in accordance with an embodiment of the present invention wherein the side lobes are contiguous with the main signal.

In accordance with another embodiment of the present invention the side lobes 810 and 820 are contiguous with the main signal 800 at 980 nm as illustrated in FIG. 8. The refractive index changes in the blazed grating are determined as described above.

In accordance with another embodiment of the present invention the blaze angle is kept between 4 to 10 degrees in order to avoid a strong polarization dependence of the light signal after having passed through the blazed grating. Furthermore, the coupling efficiency also drops with an increasing blaze angle.

The above-described embodiments of the invention are intended to be examples of the present invention and numerous modifications, variations, and adaptations may be made to the particular embodiments of the invention without departing from the scope and spirit of the invention, which is defined in the claims.

What is claimed is:

1. A feedback, feedforward optical circuit having a monitor tap comprising:

a Bragg grating having a reflection band at a laser wavelength $\lambda_L$ for reflecting no more than 10% of light incident thereon backwards for providing feedback, said Bragg grating being disposed in an optical fiber having a core and a cladding, and wherein said Bragg grating has a reflection spectrum having one or more side lobes adjacent the reflection band of wavelengths for reflecting light of a wavelength corresponding to the one or more side lobes being different than the laser wavelength $\lambda_L$, said one or more side lobes are obtained by apodization other than a Gaussian apodization, said Bragg grating further having a blaze with respect to an optical axis of the optical fiber, the grating having a blaze angle that will direct less than 5% of light incident thereon out of the optical fiber through the cladding, said light having a wavelength corresponding to a wavelength $\lambda_L$, and the grating having a transmission spectrum such that at least 85% of light incident thereupon propagates through the grating without reflecting backwards at the wavelength $\lambda_L$; and, a detector disposed to receive and detect light directed out through the cladding.

2. A feedback, feedforward optical circuit as defined in claim 1 wherein the one or more side lobes are contiguous with the wavelength $\lambda_L$.

3. A feedback, feedforward optical circuit as defined in claim 1, wherein the blaze angle is greater than 3°.

4. A feedback, feedforward optical circuit as defined in claim 3, wherein the blaze angle is less than 15°.

5. A feedback, feedforward optical circuit as defined in claim 4, wherein the blaze angle is substantially about 6°.

6. A feedback, feedforward optical circuit as defined in claim 4 wherein the blaze angle is greater than or equal to 4° and less than or equal to 11°.

7. A feedback, feedforward optical circuit as defined in claim 1 further comprising a control circuit for providing feedback.

8. A feedback, feedforward optical circuit having a monitor tap comprising:

(a) a pump laser for providing light having a laser wavelength $\lambda_L$;

(b) a blazed fiber Bragg grating disposed within a core of an optical fiber for receiving the laser wavelength $\lambda_L$ from the pump laser, said blazed fiber Bragg grating having a reflection band at the laser wavelength $\lambda_L$ for reflecting no more than 10% of the light incident thereon backwards for providing feedback, said blazed fiber Bragg grating has a reflection spectrum having one or more side lobes adjacent the reflection band, said side lobes having wavelengths for reflecting light of a wavelength corresponding to the one or more side lobes and wherein said wavelengths of the side lobes are different than the laser wavelength $\lambda_L$, said side lobes being obtained by a non-Gaussian apodization, said blazed fiber Bragg grating having a transmission spectrum such that at least 85% of light incident thereupon propagates through the grating without reflecting backwards at the wavelength $\lambda_L$, and said blazed fiber Bragg grating further having a blaze with respect to an optical axis of the optical fiber, the blazed fiber Bragg grating having a blaze angle such that the blazed fiber Bragg grating directs less than 5% of light incident thereon out of the optical fiber through a cladding, said light being directed out of the optical fiber having a wavelength corresponding to a wavelength $\lambda_L$;

(c) a detector disposed to receive and detect the light being directed out through the cladding of the optical fiber through the blazed fiber Bragg grating, and wherein said detector is for providing a control signal; and (d) a control circuit for receiving the control signal from the detector and for providing the control signal to the pump laser for monitoring a power level of the pump laser.

9. A feedback, feedforward optical circuit as defined in claim 8 wherein the control circuit is for sending the control signal to the pump laser for adjusting the power level of the pump laser.

10. A feedback, feedforward optical circuit as defined in claim 9 wherein the side lobes are contiguous with the wavelength $\lambda_L$.

11. A feedback, feedforward optical circuit as defined in claim 9 wherein the side lobes are enhanced by generating a stitch error in the blazed fiber Bragg grating.

12. A feedback, feedforward optical circuit as defined in claim 8, wherein the blaze angle is greater than 3°.

13. A feedback, feedforward optical circuit as defined in claim 12, wherein the blaze angle is less than 15°.

14. A feedback, feedforward optical circuit as defined in claim 13, wherein the blaze angle is substantially about 6°.

15. A feedback, feedforward optical circuit as defined in claim 13 wherein the blaze angle is greater than or equal to 4° and less than 11°.

16. A feedback, feedforward optical circuit having a monitor tap comprising:

(a) a pump laser for providing light having a laser wavelength $\lambda_L$;

(b) a blazed fiber Bragg grating disposed within a core of an optical fiber for receiving the laser wavelength $\lambda_L$ from the pump laser, said blazed fiber Bragg grating having a reflection band at the laser wavelength $\lambda_L$ for reflecting no more than 10% of the light incident thereon backwards for providing feedback, said blazed fiber Bragg grating has a reflection spectrum having one or more side lobes adjacent the reflection band, said side lobes having wavelengths for reflecting light of a wavelength corresponding to the one or more side lobes and wherein said wavelengths of the side lobes are different than the laser wavelength $\lambda_L$, said side lobes being determined by apodization, said blazed fiber Bragg grating having a transmission spectrum such that at least 85% of light incident thereupon propagates through the grating without reflecting backwards at the wavelength $\lambda_L$, and said blazed fiber Bragg grating further having a blaze with respect to an optical axis of the optical fiber, the blazed fiber Bragg grating having a blaze angle such that the blazed fiber Bragg grating directs less than 5% of light incident thereon out of the optical fiber through a cladding, said light being directed out of the optical fiber having a wavelength corresponding to a wavelength $\lambda_L$;

(c) a detector disposed to receive and detect the light being directed out through, the cladding of the optical fiber through the blazed fiber Bragg grating, and wherein said detector is for providing a control signal; and (d) a control circuit for receiving the control signal from the detector and for providing the control signal to the pump laser for monitoring a power level of the pump laser.

* * * * *